(12) United States Patent
Kim

(10) Patent No.: US 8,301,962 B2
(45) Date of Patent: Oct. 30, 2012

(54) APPARATUS AND METHOD FOR GENERATING A LINEAR CODE

(75) Inventor: Jae-Yoel Kim, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 1090 days.

(21) Appl. No.: 12/205,009

(22) Filed: Sep. 5, 2008

(65) Prior Publication Data

US 2009/0066545 A1 Mar. 12, 2009

(30) Foreign Application Priority Data

Sep. 6, 2007 (KR) .................. 10-2007-0090686

(51) Int. Cl.
*H03M 13/00* (2006.01)
(52) U.S. Cl. ........................................ 714/753
(58) Field of Classification Search .......... 714/752–757, 714/766, 779–788, 790, 792, 796, 823, 824
See application file for complete search history.

(56) References Cited

U.S. PATENT DOCUMENTS

| | | | | |
|---|---|---|---|---|
| 6,684,364 B2* | 1/2004 | Cameron | ...................... | 714/785 |
| 7,130,358 B2* | 10/2006 | Kim et al. | ...................... | 375/298 |
| 7,549,105 B2* | 6/2009 | Shen et al. | ...................... | 714/755 |
| 7,607,063 B2* | 10/2009 | Kikuchi et al. | ................ | 714/752 |
| 2002/0171568 A1* | 11/2002 | Yang | ............................... | 341/96 |
| 2006/0156168 A1* | 7/2006 | Shen et al. | ...................... | 714/752 |
| 2007/0113147 A1* | 5/2007 | Hong et al. | ...................... | 714/758 |

FOREIGN PATENT DOCUMENTS

| | | |
|---|---|---|
| KR | 10-2002-0027293 | 4/2002 |
| KR | 10-2002-0031554 | 5/2002 |
| KR | 10-2004-0085545 | 10/2004 |
| KR | 10-2005-0100848 | 10/2005 |

* cited by examiner

*Primary Examiner* — Nadeem Iqbal
(74) *Attorney, Agent, or Firm* — The Farrell Law Firm, P.C.

(57) ABSTRACT

An apparatus for generating a linear code according to the present invention includes a coding unit for coding input bits with a second coding scheme which is different from a first coding scheme for generating the linear code; and a rearrangement unit for generating the linear code by rearranging the bits coded with the second coding scheme. The present invention can provide a coding apparatus and method capable of reducing complexity by adaptively applying it to various coding scheme.

30 Claims, 17 Drawing Sheets

FIG.1A  $G = \begin{bmatrix} 1 & 0 & 1 & 1 & 0 & 0 & 1 \\ 0 & 0 & 0 & 1 & 1 & 1 & 1 \\ 1 & 1 & 0 & 1 & 1 & 0 & 1 \end{bmatrix}$ FIG.1B  $G = \begin{bmatrix} \boxed{1} & \boxed{0} & \boxed{1} & \boxed{1} & \boxed{0} & \boxed{0} & \boxed{1} \\ \boxed{0} & \boxed{0} & \boxed{0} & \boxed{1} & \boxed{1} & \boxed{1} & \boxed{1} \\ \boxed{1} & \boxed{1} & \boxed{0} & \boxed{1} & \boxed{1} & \boxed{0} & \boxed{1} \end{bmatrix}$
↓ ↓ ↓ ↓ ↓ ↓ ↓
5 4 1 7 6 2 7

FIG.1C  $G = \begin{bmatrix} 0 & 1 & 0 & 1 & 0 & 1 & 0 & 1 \\ 0 & 0 & 1 & 1 & 0 & 0 & 1 & 1 \\ 0 & 0 & 0 & 0 & 1 & 1 & 1 & 1 \end{bmatrix}$ FIG.1D  $G = \begin{bmatrix} \boxed{0} & \boxed{1} & \boxed{0} & \boxed{1} & \boxed{0} & \boxed{1} & \boxed{0} & \boxed{1} \\ \boxed{0} & \boxed{0} & \boxed{1} & \boxed{1} & \boxed{0} & \boxed{0} & \boxed{1} & \boxed{1} \\ \boxed{0} & \boxed{0} & \boxed{0} & \boxed{0} & \boxed{1} & \boxed{1} & \boxed{1} & \boxed{1} \end{bmatrix}$
↓ ↓ ↓ ↓ ↓ ↓ ↓ ↓
0 1 2 3 4 5 6 7

FIG. 8B $$G = \begin{bmatrix} 1 & 0 & 0 & 1 & 0 & 1 \\ 0 & 1 & 0 & 0 & 1 & 1 \\ 0 & 0 & 1 & 1 & 1 & 1 \end{bmatrix}$$
$$\phantom{G=}\ \ \downarrow\ \ \downarrow\ \ \downarrow\ \ \downarrow\ \ \downarrow\ \ \downarrow$$
$$\phantom{G=}\ \ 1\ \ \ 2\ \ \ 4\ \ \ 5\ \ \ 6\ \ \ 7$$

FIG.10A $$G = \begin{bmatrix} 1 & 0 & 0 & 1 \\ 0 & 1 & 0 & 0 \\ 0 & 0 & 1 & 1 \end{bmatrix}$$
$$\phantom{G=}\ \ \downarrow\ \ \downarrow\ \ \downarrow\ \ \downarrow$$
$$\phantom{G=}\ \ 1\ \ \ 2\ \ \ 4\ \ \ 5$$

FIG.10B

APPARATUS AND METHOD FOR GENERATING A LINEAR CODE

PRIORITY

This application claims the benefit under 35 U.S.C. §119 (a) of a Korean Patent Application filed in the Korean Intellectual Property Office on Sep. 6, 2007 and assigned Serial No. 2007-90686, the disclosures of which are incorporated herein by reference.

BACKGROUND OF THE INVENTION

1. Field of the Invention

The present invention relates generally to a coding apparatus and method, and in particular, to a linear coding apparatus and method.

2. Description of the Related Art

Generally, coding methods are used in various fields such as communication system and various storage media. By coding the original data using such coding theories, it is possible to safely transmit or store data.

In the coding methods, when a set of codewords, composed of several codewords, is used, linear codes obtained by adding linearity to the set of codewords are most popularly used.

In the coding theory, for all codewords in a code set, when a sum of two arbitrary codewords becomes again a codeword of the code set, the code set is called a 'linear code'. That is, a code set is assumed as C, and for two arbitrary codewords Ci and Cj, Ci+Cj becomes again a codeword that belongs to a codeword set C. Such a property is called 'linearity', and a code set having the linearity is called a 'linear code'. The linear code is popularly used in various fields for its realization simplicity and its design simplicity for theoretical structures.

The typical exemplary linear codes in the coding theory will be described. Error correcting codes include block codes, convolutional codes, and turbo codes. The error correcting codes are used in many communication systems and various fields, including a multimedia system such as hard disk, CD disk, and DVD disk. As a sequence generator, modified sequence generators other than a Walsh code generator and an m-sequence generator are used in several systems, including the communication system. The term 'sequence generator' as used herein means a code generator that generates a codeword by selecting some sequences from a set of multiple sequences.

These various code generators are popularly used in various fields. Though it is important to design code sets having superior performance due to performance change based on code generation in using the code generators, it is also important to simply generate codewords in generating a code which is an element of a code set. For most codes, code sets with linearity guaranteed are used in order to maximize simplicity of theoretical analysis and minimize complexity of code generators in terms of performance. The block code, convolutional code, turbo code, Walsh code, and m-sequence, which are the above-stated typical linear coding methods, guarantee low generation complexity and high performance.

The above linear coding methods need optimization for generation complexity according to their application fields, and there is a need for various optimized linear code generation methods according thereto.

In some cases, systems using the linear coding methods should process linear codes using different coding schemes. In this case, the systems may suffer an increase in complexity of linear encoders in order to accept all of the linear coding methods.

SUMMARY OF THE INVENTION

Accordingly, the present invention provides an apparatus and method for efficiently generating linear codes.

Further, present invention provides a linear code generation apparatus and method capable of reducing complexity of a code generator.

Further, present invention provides a linear code generation apparatus and method for outputting a desired linear code by rearranging an output of a Reed-Muller encoder.

According to one aspect of the present invention, there is provided a method for generating a linear code. The method includes coding input bits with a second coding scheme which is different from a first coding scheme for generating the linear code; and generating the linear code by rearranging the bits coded with the second coding scheme.

According to another aspect of the present invention, there is provided an apparatus for generating a linear code. The apparatus includes a coding unit for coding input bits with a second coding scheme which is different from a first coding scheme for generating the linear code; and a rearrangement unit for generating the linear code by rearranging the bits coded with the second coding scheme.

BRIEF DESCRIPTION OF THE DRAWINGS

The above and other aspects, features and advantages of the present invention will become more apparent from the following detailed description when taken in conjunction with the accompanying drawings in which:

FIGS. 1A to 1E are diagrams illustrating a relationship between generating matrixes for generating a linear code and a linear code matrix according to the present invention;

FIG. 8B is a diagram illustrating a generating matrix based on the code generator of FIG. 8A;

FIGS. 10A and 10B are diagrams illustrating arbitrary codeword generating matrixes;

DETAILED DESCRIPTION OF PREFERRED EMBODIMENTS

Figure 1E:
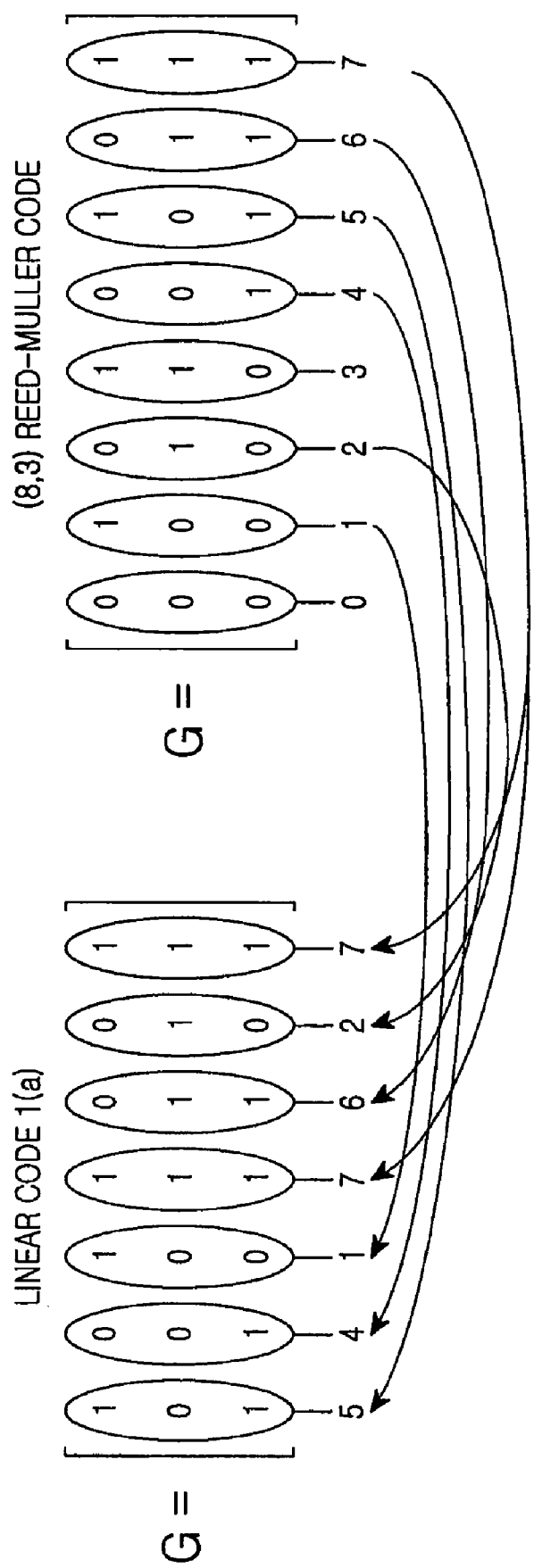

Preferred embodiments of the present invention will now be described in detail with reference to the annexed drawings. In the following description, a detailed description of known functions and configurations incorporated herein has been omitted for clarity and conciseness.

In the coding theory, for a linear code, its codeword generation is generally defined by a generating matrix. That is, a particular linear code is defined by its generating matrix, and codewords belonging to the linear code are generated by the generating matrix. Such an expression is possible as the linear code can be expressed in a vector space which is a mathematical structure.

FIG. 1A is a diagram illustrating generating matrixes for generating an arbitrary linear code.

With reference to FIG. 1A, a generating matrix will be described. In FIG. 1A, a linear code defined by a generating matrix G has a code length of, for example, 7. The term 'code length' means a length of a column in a generating matrix G. In addition, since the number of rows in the generating matrix is 3, the number of codewords belonging to a linear code defined by the generating matrix is 2 number of rows=2³=8. Generally, for a (n,k) linear code, its generating matrix is composed of n columns and k rows, and in a codeword generation process, when a k-bit input signal is received, an n-bit codeword is output. Therefore, the codeword generation process can be mathematically expressed as Equation (1).

$$(c_1 c_2 \ldots c_n) = C = I^*G = (i_1 i_2 \ldots i_k)^*G \quad (1)$$

In Equation (1), ci means a codeword generated through a coding process, and ii means a k-bit input signal stream. With reference to Equation (1), a codeword generation process will be described. When a k-bit input signal stream I is received, it is multiplied by a generating matrix, i.e., a generating polynomial G, as shown in Equation (1). An n-bit code stream C is generated as a result of the multiplication by the generating polynomial G. Here, the possible number of codewords generated through the coding process is the possible number of input signals. The possible number of input signals is 2k, if codeword bits are binary numbers. Therefore, 2k codewords can be generated by Equation (1). Regarding the meaning of Equation (1), it can be understood that a codeword generation process generates codewords as a linear combination of bit streams of each length-n row in a generating matrix according to input signals.

FIG. 1C is a diagram illustrating a generating matrix of a (8,3) Reed-Muller code among linear codes.

A Reed-Muller code, which is well known in the coding theory, is simple in its coding and decoding, and is very superior even in terms of performance. The details of the Reed-Muller code are disclosed in reference [1] below. Therefore, the details of the Reed-Muller code will not be provided herein.

Reference [1]: The Theory of Error Correcting codes, MacWilliams, F. J. and Sloane, J. J. (1977). North Holland For a better understanding of the present invention, a description of the present invention will be made with reference to FIG. 1C. A generating matrix of a (8,3) Reed-Muller code is as shown in FIG. 1C. FIG. 1D illustrates a characteristic of each column using a generating matrix of the Reed-Muller code shown in FIG. 1C in order to show a characteristic of a generating matrix of one Reed-Muller code. When a characteristic of a generating matrix of a Reed-Muller code is considered with reference to FIG. 1D, each column of the generating matrix is composed of 3 bits, and each column can be expressed by decimalizing. Since a bit stream of the first column is 000, it can be decimalized to 0; since the second column is 001, it can be decimalized to 1; since the third column is 010, it can be decimalized to 2; since the fourth column is 011, it can be decimalized to 3; since the fifth column is 100, it can be decimalized to 4; since the sixth column is 101, it can be decimalized to 5; since the seventh column is 110, it can be decimalized to 6; and since the eighth column is 111, it can be decimalized to 7. The decimalized numbers represent all possible numbers that can be expressed with a 3-bit stream.

Here, a generating matrix of a particular linear code shown in FIG. 1A can be expressed as shown in FIG. 1B, when it is expressed in the same method as the characteristic of the Reed-Muller code. That is, since the first column is 101, it is 5; since the second column is 100, it is 4; since the third column is 001, it is 1; since the fourth column is 111, it is 7; since the fifth column is 110, it is 6; since the sixth column is 010, it is 2; and since the seventh column is 111, it is 7.

FIG. 1E is a diagram illustrating a relationship between the generating matrix shown in FIG. 1A and the generating matrix shown in FIG. 1C when the above method is used.

Referring to FIG. 1E, the generating matrix of the linear code shown in FIG. 1A is shown in the left side, the Reed-Muller generating matrix of FIG. 1C is shown in the right side, and a relationship between columns is shown in the drawing. That is, it can be understood that it is possible to generate the same matrix as the generating matrix of the linear code shown in FIG. 1A, by rearranging (relocating) columns of a (8,3) Reed-Muller generating matrix shown in the right side.

In other words, since a decimalized expression of the first column in the generating matrix of the linear code shown in the left side is 5, the sixth column, whose decimalized expression of the right-side (8,3) Reed-Muller generating matrix is 5, is arranged; since a decimalized expression of the second column is 4, the fifth column, whose decimalized expression of the right-side (8,3) Reed-Muller generating matrix is 4, is arranged; since a decimalized expression of the third column is 1, the second column, whose decimalized expression of the right-side (8,3) Reed-Muller generating matrix is 1, is arranged; since a decimalized expression of the fourth column is 7, the eighth column, whose decimalized expression of the right-side (8,3) Reed-Muller generating matrix is 7, is arranged; since a decimalized expression of the fifth column is 6, the seventh column, whose decimalized expression of the right-side (8,3) Reed-Muller generating matrix is 6, is arranged; since a decimalized expression of the sixth column is 2, the third column, whose decimalized expression of the right-side (8,3) Reed-Muller generating matrix is 2, is arranged; and since a decimalized expression of the seventh column is 7, the eighth column, whose decimalized expression of the right-side (8,3) Reed-Muller generating matrix is 7, is arranged.

It can be appreciated from the above analysis method that a generating matrix of a linear code can be expressed by rearranging a generating matrix of a Reed-Muller code. Therefore, it can be noted that codewords of an arbitrary linear code can be generated by applying the rearrangement method to Reed-Muller codewords in the same way.

Figure 2:
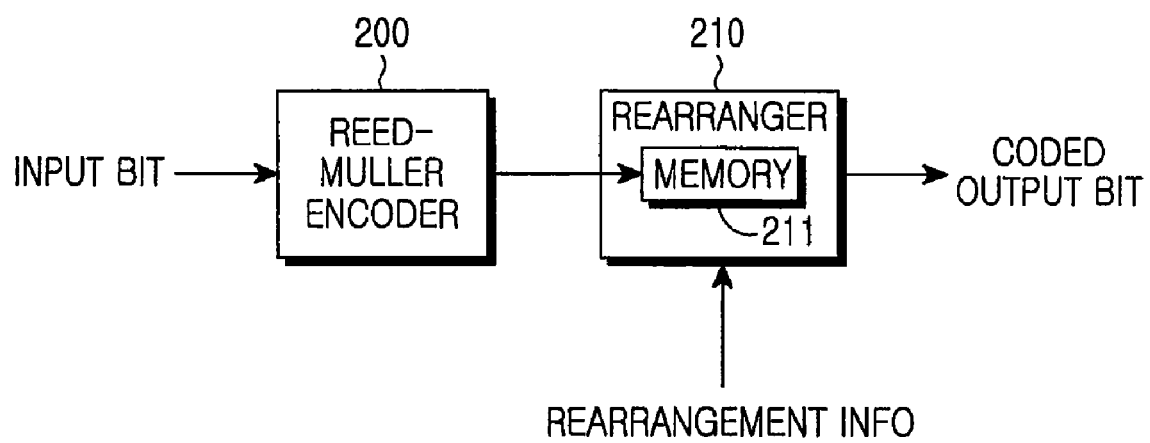
FIG. 2 is a block diagram illustrating a codeword generator according to an embodiment of the present invention.

FIG. 2 is a block diagram illustrating a codeword generator according to an embodiment of the present invention.

The codeword generator of FIG. 2 includes a Reed-Muller encoder 200 and a rearranger 210. An input signal to an encoder according to the present invention is subjected to Reed-Muller coding in the Reed-Muller encoder 200, outputting a Reed-Muller codeword corresponding to the input signal. In Reed-Muller-coding an input codeword, the Reed-Muller encoder 200 can be realized with a particular coding method, i.e., can be realized using a generating matrix of a Reed-Muller codeword, or using a lookup table to make it possible to store all possible codewords in a table and output corresponding codewords. A Reed-Muller codeword output from the Reed-Muller encoder 200 is input to the rearranger 210. The Reed-Muller codeword input to the rearranger 210 is stored in a memory 211 in the rearranger 210. Then the rearranger 210 receives rearrangement information based on the generating matrix of the linear code, and sequentially outputs codeword bits corresponding to a pattern of the rearrangement information, thereby finally outputting codeword streams based on the generating matrix of the linear code among the codeword streams stored in the memory 211. The rearrangement information can be provided by an undepicted controller. Alternatively, the rearranger 210 can previously store the rearrangement information, and use the stored rearrangement information.

For a better understanding of an operation of the encoder shown in FIG. 2, a coding operation for a linear matrix of FIG. 1A will be described with reference to FIG. 2. Before a description of the operation is given, rearrangement information will be described. For example, as shown in FIG. 1B, columns of a linear code's generating matrix are decimalized to 5, 4, 1, 7, 6, 2 and 7, and used as rearrangement information. In this case, since decimalized numbers of columns of a Reed-Muller generating matrix vary from 0 to 7, the rearrangement information 0 represents the first column, the rearrangement information 1 represents the second column, and the rearrangement information 2 represents the third column. In this manner, the rearrangement information 7 represents the eighth column.

A coding operation for the linear matrix of FIG. 1A will be described with reference to FIG. 2. Assume that a 3-bit input signal '011' is received. In this case, if the input signal '011' is input to the Reed-Muller encoder 200, the Reed-Muller encoder 200 Reed-Muller-codes the input signal '011' using a generating matrix of the (8,3) Reed-Muller code shown in FIG. 1C. At this point, the output codeword is output as a codeword of an 8-bit stream '01100110' in accordance with Equation (1). Then, the output codeword stream is stored in the memory 211 in the rearranger 210. The rearranger 210 then sequentially receives the rearrangement information 5, 4, 1, 7, 6, 2 and 7. Here, if the rearrangement information 5 is first received, the $6^{th}$ signal '1' in the codeword stream stored in the memory 211 is output; if 4 is received next, the $5^{th}$ signal '0' in the codeword stream stored in the memory 211 is output; if 1 is received next, the $2^{nd}$ signal '1' in the codeword stream stored in the memory 211 is output; if 7 is received next, the $8^{th}$ signal '0' in the codeword stream stored in the memory 211 is output; if 6 is received next, the $7^{th}$ signal '1' in the codeword stream stored in the memory 211 is output; if 2 is received next, the $3^{rd}$ signal '1' in the codeword stream stored in the memory 211 is output; and if 7 is received next, the $8^{th}$ signal '0' in the codeword stream stored in the memory 211 is output. Therefore, the code stream which is finally output through the rearranger 210 is 1010110, and the output of the rearranger 210 is identical to the codeword generated according to the generating matrix of FIG. 1A, for the same input signal.

In the foregoing embodiment, a coding operation for an arbitrary linear code has been described. In the following embodiment, a description will be made of a coding operation when the convolutional code, which is used in many fields, among the linear codes, is realized with an encoder according to the present invention.

Before a description of an embodiment of coding the convolutional code with an encoder proposed by the present invention is given, a brief description of the convolutional code will be made below.

Figure 3:
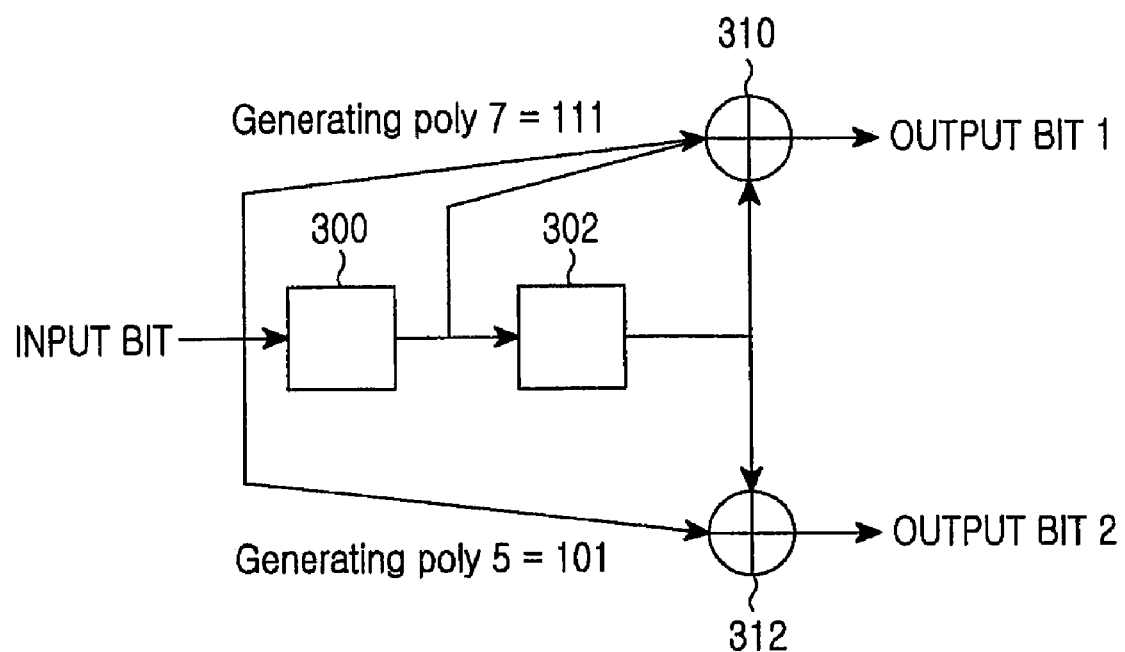
FIG. 3 is a block diagram illustrating a structure of a convolutional encoder with code rate=½ and generating polynomial=(7,5)

FIG. 3 is a block diagram illustrating a structure of a convolutional encoder with code rate=½ and generating polynomial=(7,5).

A brief description of a structure of the convolutional encoder will be given. Coded bits per input bit, the number of which is equal to a reciprocal of the code rate, are generated by means of the convolutional encoder, and the convolutional encoder should have the same number of generating polynomials. For example, for code rate=½, 2 generating polynomials are needed and they are defined as 7 and 5, respectively. A meaning of the generating polynomial 7 will be described. First, 7 is binarized to '111', and '111' means a combination of input bit, memory 1 and memory 2, i.e., 3 values, when one coded bit is output. For '111', it means that all bit values of input bit, memory 1 and memory 2 are subjected to an Exclusive OR (XOR) operation. As for the generating polynomial 5, 5 is binarized to '101', and it means that bit values of input bit and memory 2, excluding a bit value of memory 1 corresponding to '0' in '101' which are bit values of input bit, memory 1 and memory 2, are subjected to an XOR operation.

With reference to FIG. 3, the foregoing operation of the convolutional encoder will be described. Before input bits are input to the convolutional encoder, a memory #1 300 and a memory #2 302 are both initialized to 0. When the input bits are received, the input bit and the bits stored in the memories #1 300 and #2 302 are input to an XOR unit #1 310 where they are subjected to an XOR operation, and the input bit and the bit stored in the memory #2 302 are input to a XOR unit #2 312 where they are subjected to an XOR operation.

Figure 4A:
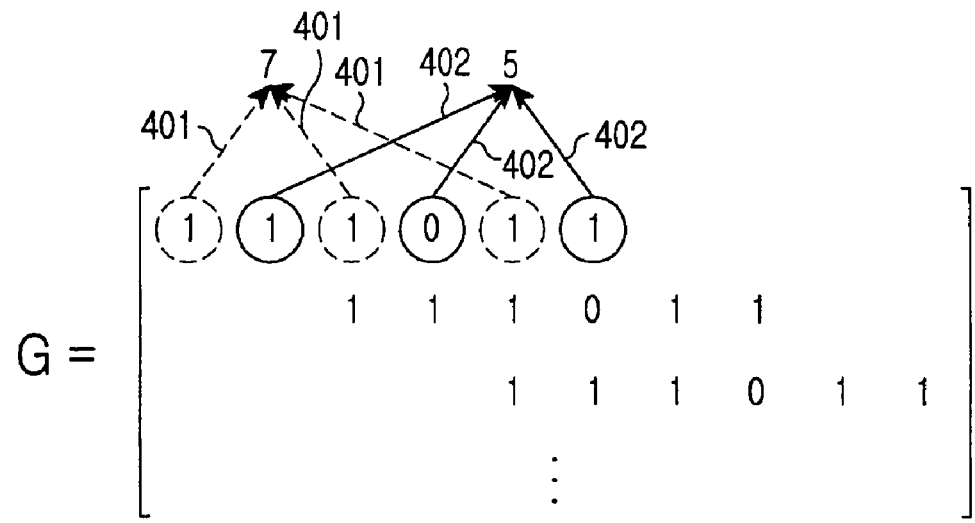
FIGS. 4A and 4B are diagrams illustrating an example of expressing a matrix of a convolutional codeword with a codeword according to the present invention.

A generating matrix for the convolutional code of FIG. 3 will be considered with reference to FIG. 4A. Referring to FIG. 4A, a generating matrix of a convolutional code will be described. A generating polynomial used in the convolutional code is expressed using binary values. That is, when binary values of the generating polynomials 7='111' and 5='101' used in the above example are alternately arranged, the result becomes '111011'. In FIG. 4A, dotted lines shown by reference numeral 401 indicate an arrangement of '111' meaning the generating polynomial 7, and solid lines shown by reference numeral 402 indicate an arrangement of '101' meaning the generating polynomial 5.

When such bit streams are arranged rightward in every row in a generating matrix by a reciprocal of the code rate, a generating matrix for the convolutional code is expressed. If the exemplary concept of FIG. 1B according to the present invention is applied to the generated matrix, a generating matrix of the convolutional code can be generated as shown in FIG. 4B.

Figure 4B:
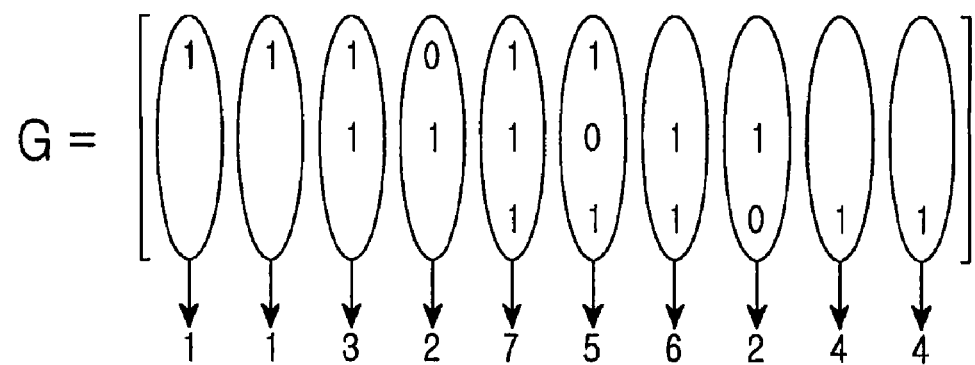

FIG. 4B is a diagram illustrating a rearrangement pattern for a generating matrix of an encoder proposed by the present invention, which replaces a convolutional code.

Herein, the number of input bits is assumed to be 3. That is, the number of rows in the generating matrix corresponding to a size of the input bits is 3, and a length of a codeword, i.e., the number of columns is 10.

Referring to FIG. 4B, a rearrangement pattern of a generating matrix 4b will be described. Since a bit stream of the first column in the generating matrix 4b is '001', it is decimalized to 1; since a bit stream of the second column is '001', it is decimalized to 1; since a bit stream of the third column is '011', it is decimalized to 3; since a bit stream of the fourth column is '010', it is decimalized to 2; since a bit stream of the fifth column is '111', it is decimalized to 7; since a bit stream of the sixth column is '101', it is decimalized to 5; since a bit stream of the seventh column is '110', it is decimalized to 6; since a bit stream of the eighth column is '010', it is decimalized to 2; since a bit stream of the ninth column is '100', it is decimalized to 4; and since a bit stream of the tenth column is '100', it is decimalized to 4. Therefore, the rearrangement information based on the generating matrix of the convolutional code becomes 1, 1, 3, 2, 7, 5, 6, 2, 4 and 4 as shown in FIG. 4B.

In the following first embodiment, a description will be made of a coding method according to the present invention, which replaces a convolutional code.

First Embodiment

A coding operation of the linear matrix shown in FIG. 4B will be described with reference to FIG. 2. Assume that a 3-bit input signal '011' is received. The input signal '011' is input to the Reed-Muller encoder 200, and the Reed-Muller encoder 200 Reed-Muller-codes the input signal '011' using the generating matrix of the (8,3) Reed-Muller code shown in FIG. 1C. The output codeword becomes an 8-bit stream '01100110' in accordance with Equation (1). The output codeword stream is stored in the memory 211 in the rearranger 210. Then the rearranger 210 sequentially receives rearrangement information 1, 1, 3, 2, 7, 5, 6, 2, 4 and 4 based on the generating matrix of the convolutional code shown in FIG. 4B. When 1 is first received, the $2^{nd}$ signal '1' in the codeword stream stored in the memory 211 is output; when 1 is received next, the $2^{nd}$ signal '1' in the codeword stream stored in the memory 211 is output; when 3 is received next, the $4^{th}$ signal '0' in the codeword stream stored in the memory 211 is output; when 2 is received next, the $3^{rd}$ signal '1' in the codeword stream stored in the memory 211 is output; when 7 is received next, the $8^{th}$ signal '0' in the codeword stream stored in the memory 211 is output; when 5 is received next, the $6^{th}$ signal '1' in the codeword stream stored in the memory 211 is output; when 6 is received next, the $7^{th}$ signal '1' in the codeword stream stored in the memory 211 is output; when 2 is received next, the $3^{rd}$ signal '1' in the codeword stream stored in the memory 211 is output; when 4 is received next, the $5^{th}$ signal '0' in the codeword stream stored in the memory 211 is output; and when 4 is received next, the $5^{th}$ signal '0' in the codeword stream stored in the memory 211 is output. Therefore, the finally output code stream becomes '1101011100', and the output code stream is identical to the codeword generated according to the generating matrix of the convolutional code shown in FIG. 4B.

In the above embodiments, the size of the input signal, i.e., input bits, is assumed to 3 bits. Here, (8,3) codes are used as the Reed-Muller code, and the memory 211 in the rearranger 210 stores an 8-bit codeword obtained by Reed-Muller-coding the input signal. For example, however, when the number of input bits increases to 6, a (64,6) code is used as the Reed-Muller code, and in this case, a size of the memory 211 considerably increases, causing a complexity problem. In this case, therefore, FIGS. 6A and 6B illustrate a structure for coding an input bit stream in a divided manner, and finally XORing codewords which are the coding results.

Figure 5:
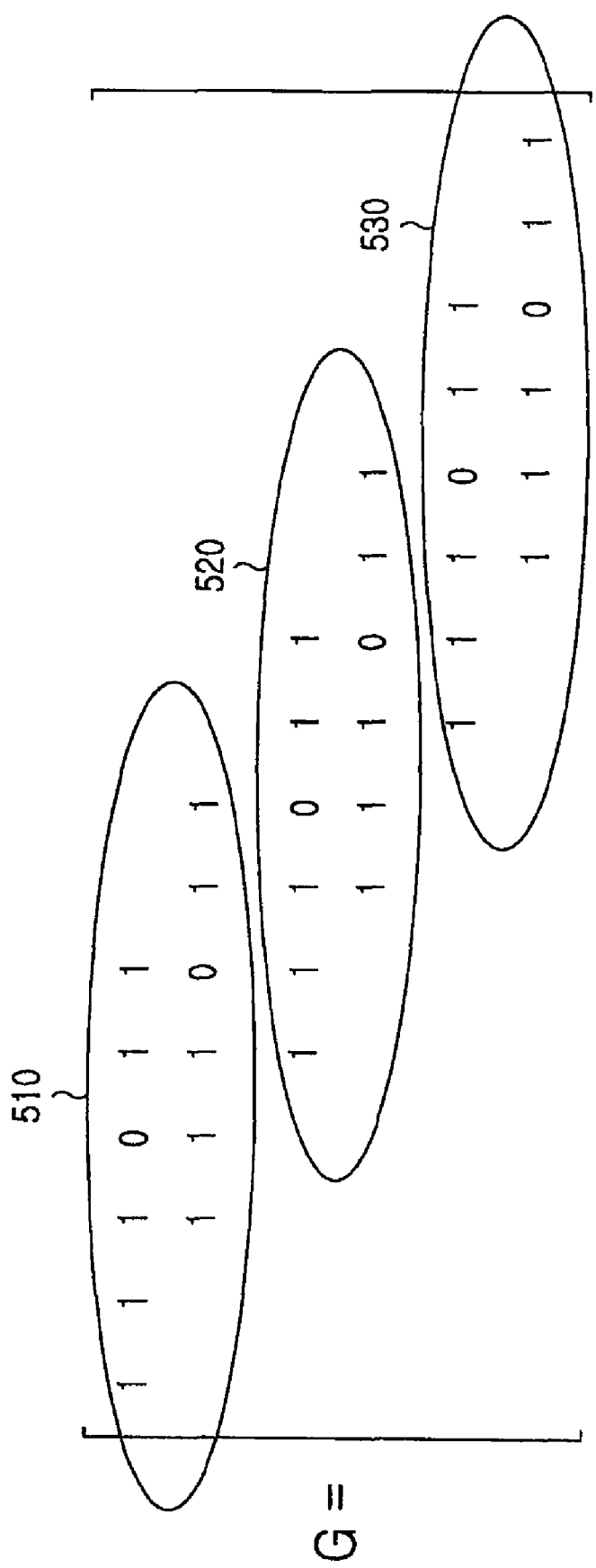
FIG. 5 is a diagram illustrating a generating matrix for a case where a convolutional code among the linear codes has a 6-bit input.

FIG. 5 is a diagram illustrating a generating matrix for a case where a convolutional code among the linear codes has a 6-bit input. With reference to FIG. 5, a description will be made of a method for coding an input bit stream in a divided manner.

Regarding a generating matrix of FIG. 5, the number of rows, which is determined according to the number of input bits, is 6, and the rows are divided into 3 parts. That is, the 2 upper rows in the generating matrix are classified as a first partial generating matrix 510, the next 2 middle rows are classified as a second partial generating matrix 520, and the last 2 rows are classified as a third partial generating matrix 530. The proposed method can XOR the coded symbols finally output after coding the input bit stream using the partial generating matrixes 510, 520 and 530. Here, the 6 input bits corresponding to the generating matrix are divided two by two, which correspond to the number of rows in the partial generating matrixes, and then coded by their associated partial generating matrixes. This concept will be described in detail using the encoders of FIGS. 6A and 6B. The total number of columns in the generating matrix or the partial generating matrixes of FIG. 5 is 16. Rearrangement information for the partial generating matrixes has 16 informations corresponding to the number of columns.

Figure 6A:
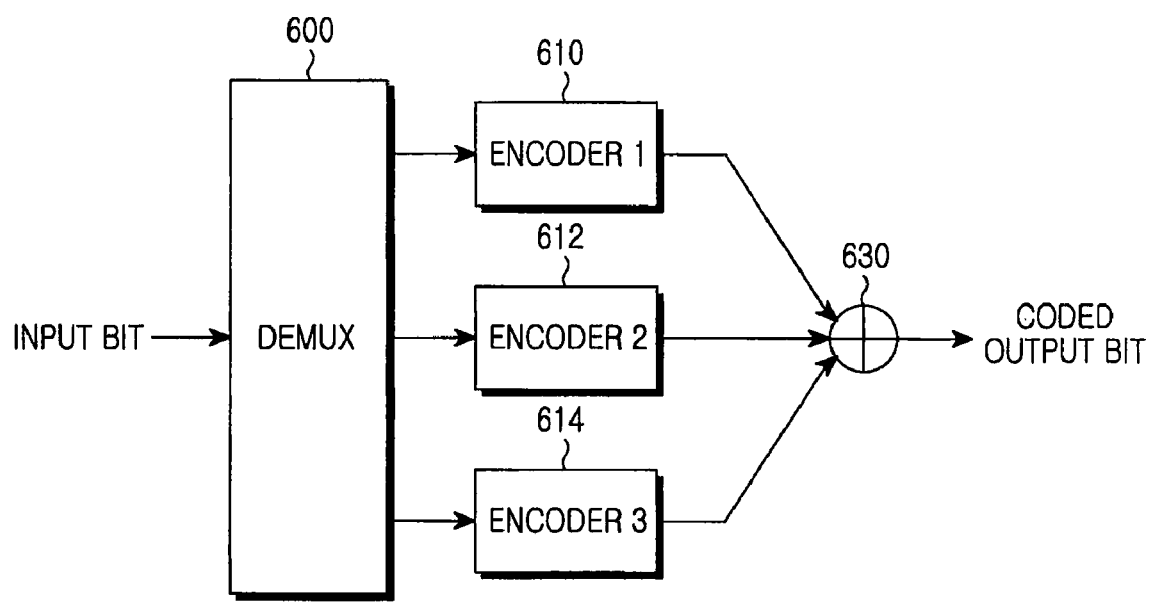
FIGS. 6A and 6B are encoder block diagrams for coding input bits in a divided manner by a linear encoder according to the present invention.
Figure 6B:
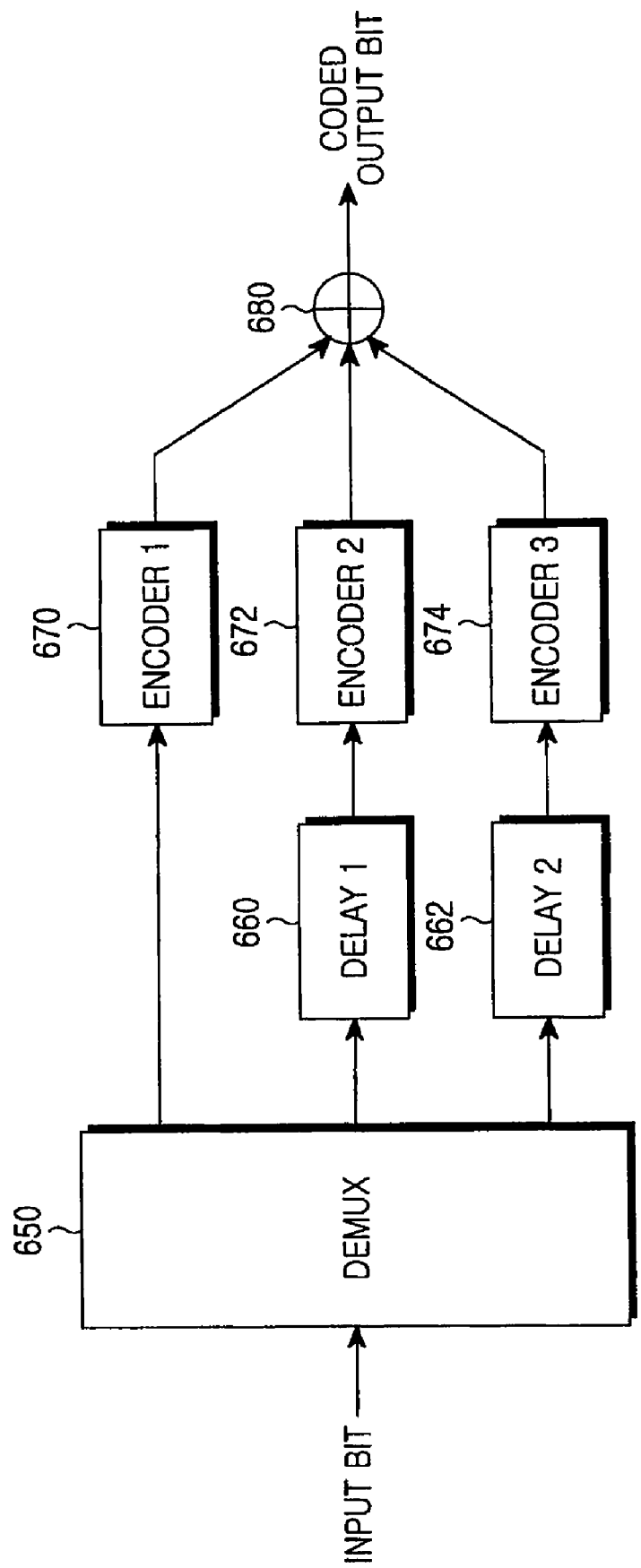

Before a description of the encoders FIGS. 6A and 6B is given, the rearrangement information for the partial generating matrixes of the generating matrix shown in FIG. 5 will be represented in the same method as that in the foregoing embodiment.

Rearrangement information of the first partial generating matrix is '1,1,3,2,3,1,2,2,0,0,0,0,0,0,0,0'; rearrangement information of the second partial generating matrix is '0,0,0,0,1,1,3,2,3,1,2,2,0,0,0,0'; and rearrangement information of the third partial generating matrix is '1,1,3,2,3,1,2,2,0,0,0,0,0,0,0,0'. An operation of the encoder based on the generating matrix of FIG. 5 will be described in a second embodiment of the present invention by applying the above rearrangement information.

Second Embodiment

FIGS. 6A and 6B are block diagrams for coding input bits in a divided manner by a linear encoder according to the present invention. After FIG. 6A is first described, FIG. 6B will be described using the difference between FIG. 6A and FIG. 6B.

Referring to FIG. 6A, when 6 input bits are input to an encoder, the input bits are input to a demultiplexer 600. Then the demultiplexer 600 divides the 6 bits two by two, and outputs first 2 bits among the 6 bits to an encoder #1 610, the next 2 middle bits to an encoder #2 612, and the last 2 bits to an encoder #3 614. Then the encoder #1 610 outputs a coded bit stream coded by the first partial generating matrix 510 of FIG. 5, the encoder #2 612 outputs a coded bit stream coded by the second partial generating matrix 520 of FIG. 5, and the encoder #3 614 outputs a coded bit stream coded by the third partial generating matrix 530 of FIG. 5. Then, the coded bits output from the encoder #1 610, the coded bits output from the encoder #2 612, and the coded bits output from the encoder #3 614 are input to an XOR unit 630 bit by bit, where they are subjected to an XOR operation. That is, the XOR unit 630 XORs all the coded bits output from the encoders, thereby generating codewords based on the entire generating matrix of FIG. 5.

Figure 7A:
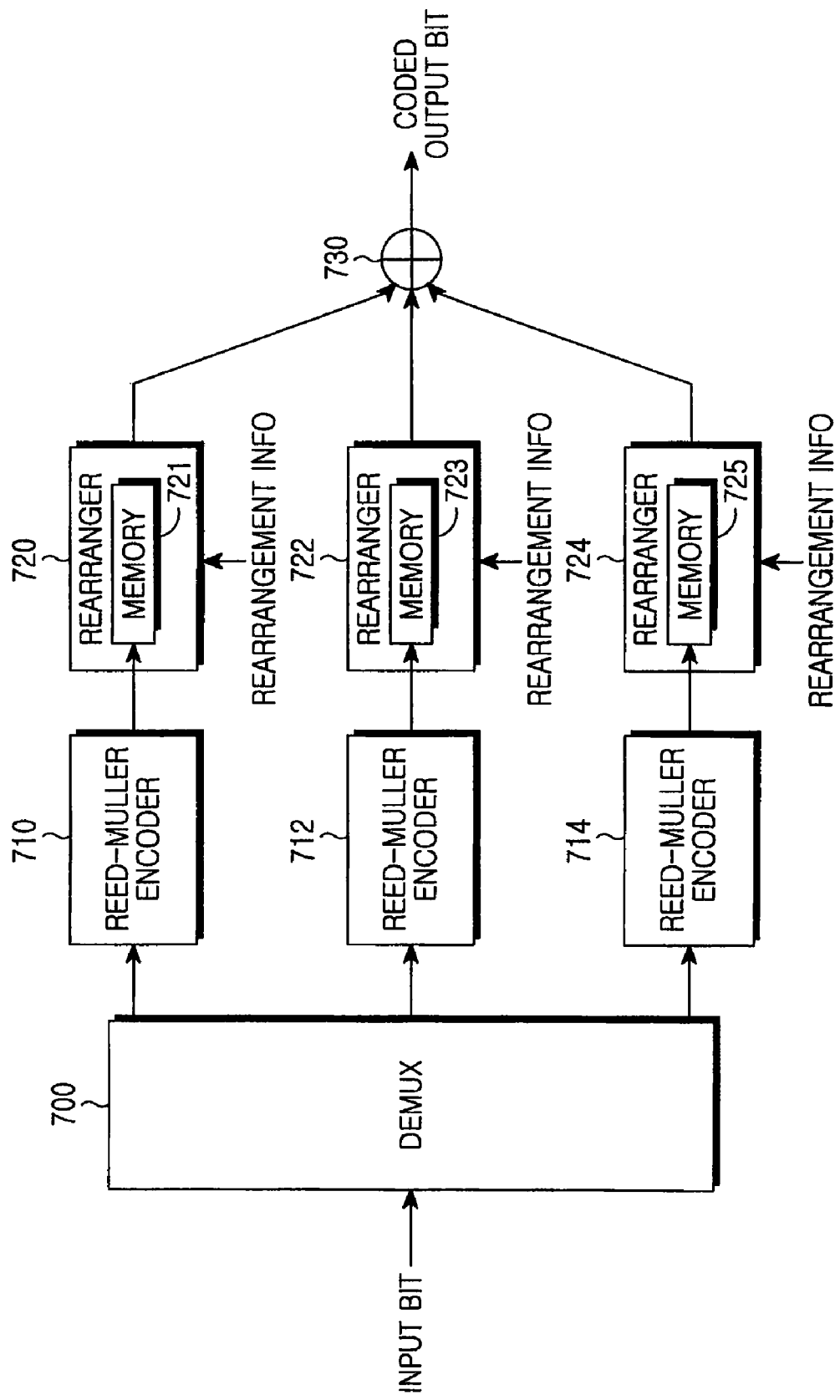
FIGS. 7A and 7B are diagram illustrating detailed examples of the encoders of FIGS. 6A and 6B.

Shown in FIG. 6A is a generalized structure for coding input bits in a divided manner when the number of input bits is greater. With reference to FIG. 7A, a description will now be made of a detailed structure for coding input bits using an encoder proposed by the present invention, i.e., Reed-Muller encoder, as the encoder of FIG. 6A.

Before a description of FIG. 7A is given, it is assumed that since the number of rows in each of the partial generating matrixes is 2, a Reed-Muller encoder used in the encoder is a (4,2) code.

When 6 input bits are input to the encoder according to the second embodiment, they are first input to a demultiplexer 700. Then the demultiplexer 700 divides the 6 bits two by two, and outputs first 2 bits among the 6 bits to a Reed-Muller encoder #1 710, the next 2 middle bits to a Reed-Muller encoder #2 712, and the last 2 bits to a Reed-Muller encoder #3 714. Then, the Reed-Muller encoder 710 Reed-Muller-codes an input signal of the first 2 bits, outputs 4 coded bits, and stores them in a memory 721 in a rearranger 720. At the same time, the Reed-Muller encoder 712 Reed-Muller-codes an input signal of the 2 middle bits, outputs 4 coded bits, and stores them in a memory 723 in a rearranger 722, and the Reed-Muller encoder 714 Reed-Muller-codes an input signal of the last 2 bits, outputs 4 coded bits, and stores them in a memory 725 in a rearranger 724.

Then, the rearranger 720 receives rearrangement information '1,1,3,2,3,1,2,2,0,0,0,0,0,0,0,0' based on the first partial generating matrix, and selects, from the memory 721, coded bits corresponding to the rearrangement information; the second rearranger 722 receives rearrangement information '0,0, 0,0,1,1,3,2,3,1,2,2,0,0,0,0' based on the second partial generating matrix, and selects, from the memory 723, coded bits corresponding to the rearrangement information; and the last rearranger 724 receives rearrangement information '0,0,0,0, 0,0,0,0,1,1,3,2,3,1,2,2' based on the third partial generating matrix, and selects, from the memory 725, coded bits corresponding to the rearrangement information. The bit streams output from the rearrangers 720, 722 and 724 are input to an XOR unit 730 bit by bit, and the XOR unit 730 XORs the coded bits received from the rearrangers 720, 722 and 724.

The generating matrix of FIG. 5 will be described in detail. According to a property of a generating matrix the convolutional code, each row of the generating matrix is a shifted form of its previous row. In addition, it can be appreciated that the partial generating matrixes 510, 520 and 530 are shifted forms of their previous partial generating matrixes. Therefore, in FIG. 6A, a difference in operation between the encoder #1 610 and the encoder #2 612 is equal to the entire operation time delay caused by a difference between the partial generating matrixes. A coding process based on the above property will be described with reference to the drawings.

FIG. 6B is an internal block diagram of an encoder based on the time delay according to the present invention.

Referring to FIG. 6B, when 6 input bits are input to an encoder, the input bits are input to a demultiplexer 650. Then the demultiplexer 650 divides the 6 bits two by two, and outputs first 2 bits among the 6 bits to an encoder #1 670, the next 2 middle bits to a delay #1 660, and the last 2 bits to a delay #2 662. Then, the delay #1 660 time-delays the 2 middle bits by a shift value between the first partial generating matrix 510 and the second partial generating matrix 520 of FIG. 5, and then outputs them to an encoder #2 672; and the delay #2 662 time-delays the last 2 bits by a shift value between the first partial generating matrix 510 and the third partial generating matrix 530 of FIG. 5, and then outputs them to an encoder #3 674. Then, the encoder #1 670 outputs coded bit streams coded by the first partial generating matrix 510 of FIG. 5; the encoder #2 672 outputs coded bit streams coded by the second partial generating matrix 520 of FIG. 5, and the encoder #3 674 outputs coded bit streams coded by the first partial generating matrix 510 of FIG. 5. The coded bits output from the encoder #1 670, the coded bits output from the encoder #2 672, and the coded bits output from the encoder #3 674 are input to an XOR unit 680 bit by bit, where they are subjected to an XOR operation. That is, the XOR unit 680 XORs all the coded bits output from the encoders, thereby generating codewords based on the entire generating matrix of FIG. 5.

The code generator of FIG. 6B delays an output time of coded bits, which are output values of the encoder #2 672 and the encoder #3 674, using the delays. Although the delays can achieve the output delay in front of the encoders, they can also perform the time delay at the back of the encoders.

Figure 7B:
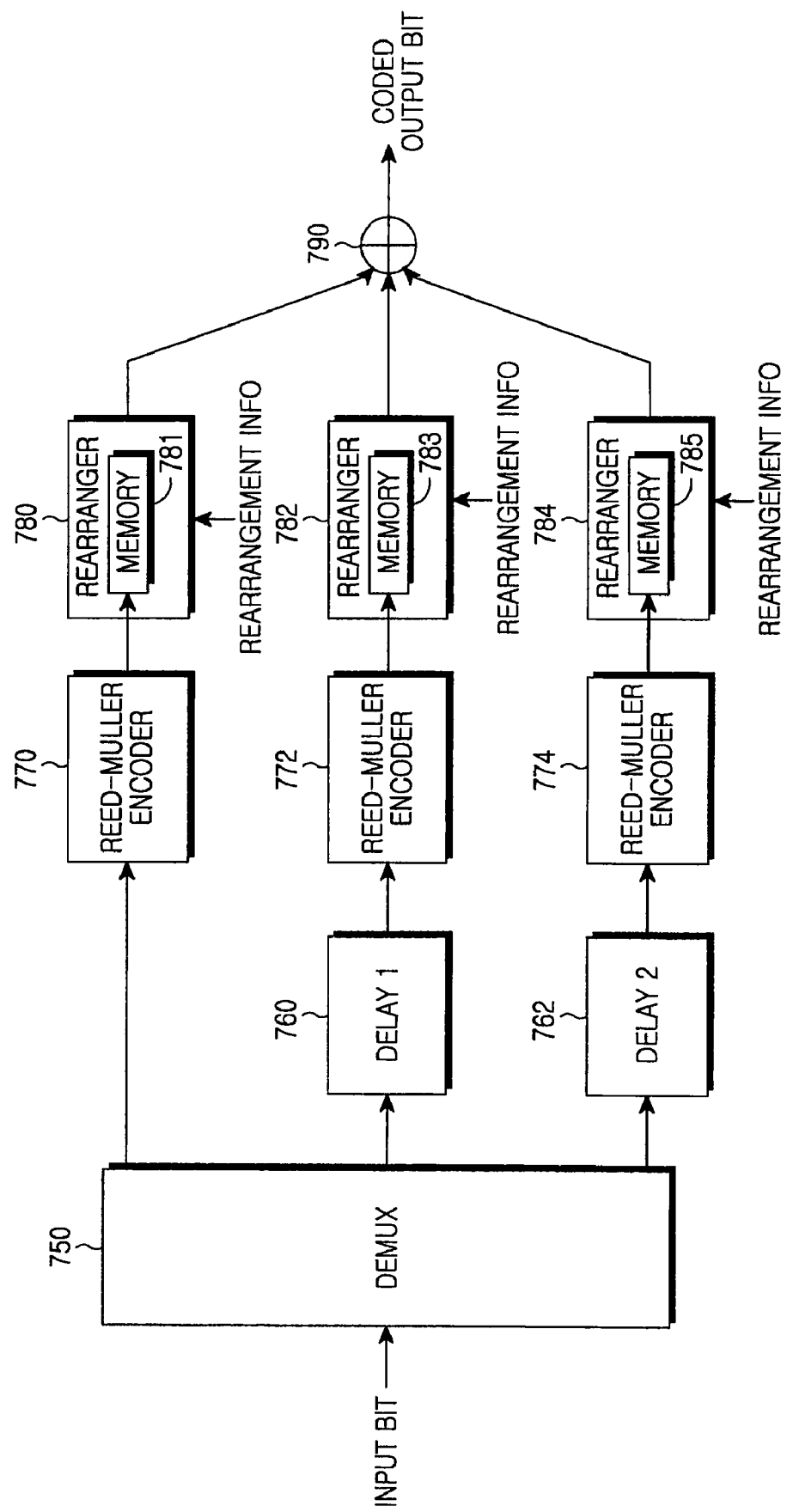

Shown in FIG. 6B is a structure of a proposed generalized encoder for coding input bits in a divided manner when the number of input bits is greater. With reference to FIG. 7B, a description will now be made of a detailed structure for coding input bits using an encoder proposed by the present invention, i.e., Reed-Muller encoder, as the encoder of FIG. 6B.

Before a description of FIG. 7B is given, it is assumed that since the number of rows in each of the partial generating matrixes is 2, a Reed-Muller encoder used in the encoder is a (4,2) code.

When 6 input bits are input to an encoder according to the second embodiment, they are input to a demultiplexer 750. Then the demultiplexer 750 divides the 6 bits two by two, and outputs first 2 bits among the 6 bits to a Reed-Muller encoder #1 770, the next 2 middle bits to a delay #1 760, and the last 2 bits to a delay #2 762. Then the delay #1 760 time-delays the 2 middle bits by a shift value between the first partial generating matrix 510 and the second partial generating matrix 520 of FIG. 5, and then outputs them to an encoder #2 772; and the delay #2 762 time-delays the last 2 bits by a shift value between the first partial generating matrix 510 and the third partial generating matrix 530 of FIG. 5, and then outputs them to an encoder #3 774. The Reed-Muller encoder 770 Reed-Muller-codes an input signal of the first 2 bits, outputs 4 coded bits, and stores them in a memory 781 in a rearranger 780. At the same time, the Reed-Muller encoder 772 Reed-Muller-codes an input signal of the time-delayed 2 middle bits, outputs 4 coded bits, and stores them in a memory 783 in a rearranger 782; and the Reed-Muller encoder 774 Reed-Muller-codes an input signal of the time-delayed last two bits, outputs 4 coded bits, and stores them in a memory 785 in a rearranger 784.

Then, the rearranger 780 receives rearrangement information '1,1,3,2,3,1,2,2,0,0,0,0,0,0,0,0' based on the first partial generating matrix, and selects, from the memory 781, coded bits corresponding to the rearrangement information; the rearranger 782 receives rearrangement information '1,1,3,2, 3,1,2,2,0,0,0,0,0,0,0,0' used in the rearranger 780, and selects, from the memory 783, coded bits corresponding to the rearrangement information; and the rearranger 784 receives rearrangement information '1,1,3,2,3,1,2,2,0,0,0,0, 0,0,0,0' used in the rearranger 780, and selects, from the memory 785, coded bits corresponding to the rearrangement information. The coded bits output from the encoder #1 780, the coded bits output from the encoder #2 782, and the coded bits output from the encoder #3 784 are input to an XOR unit 790 bit by bit, where they are subjected to an XOR operation. That is, the XOR unit 790 XORs all the coded bits output from the encoders, thereby generating codewords based on the entire generating matrix of FIG. 5.

The code generator of FIG. 7B delays an output time of coded bits, which are output values of the encoder #2 772 and the encoder #3 774, using the delays. Although the delays can achieve the output delay in front of the encoder #2 772 and the encoder #3 774, they can also perform the time delay at the back of the encoder #2 772 and the encoder #3 774 or at the back of the rearrangers 782 and 784.

It is shown from the above embodiments that code generation is possible with the code generator proposed by the present invention, for several linear codes. In further another embodiment below, it is shown that the linear code used in the actual communication system can be replaced with a linear code generator according to the present invention.

Third Embodiment

A third embodiment of the present invention provides an example where a linear code used in the actual communication system is operated with a code generator according to the present invention. An HSDPA system among the communication systems has a code generator for generating a UE-specific Scrambling code by coding a User Equipment (UE) Identifier (ID). The UE-specific Scrambling code generator is shown in FIG. 8A.

Figure 8A:
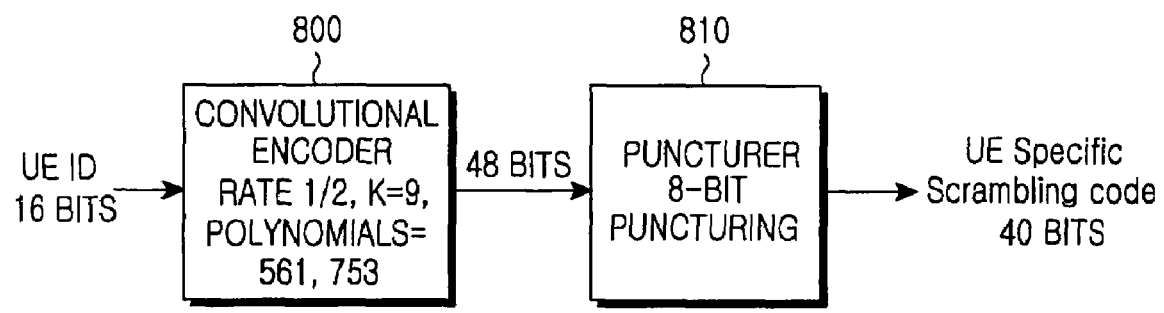
FIG. 8A is a block diagram of a UE-specific Scrambling code generator used in a communication system.

FIG. 8A is a block diagram of a UE-specific Scrambling code generator used in a communication system.

Figure 8B:
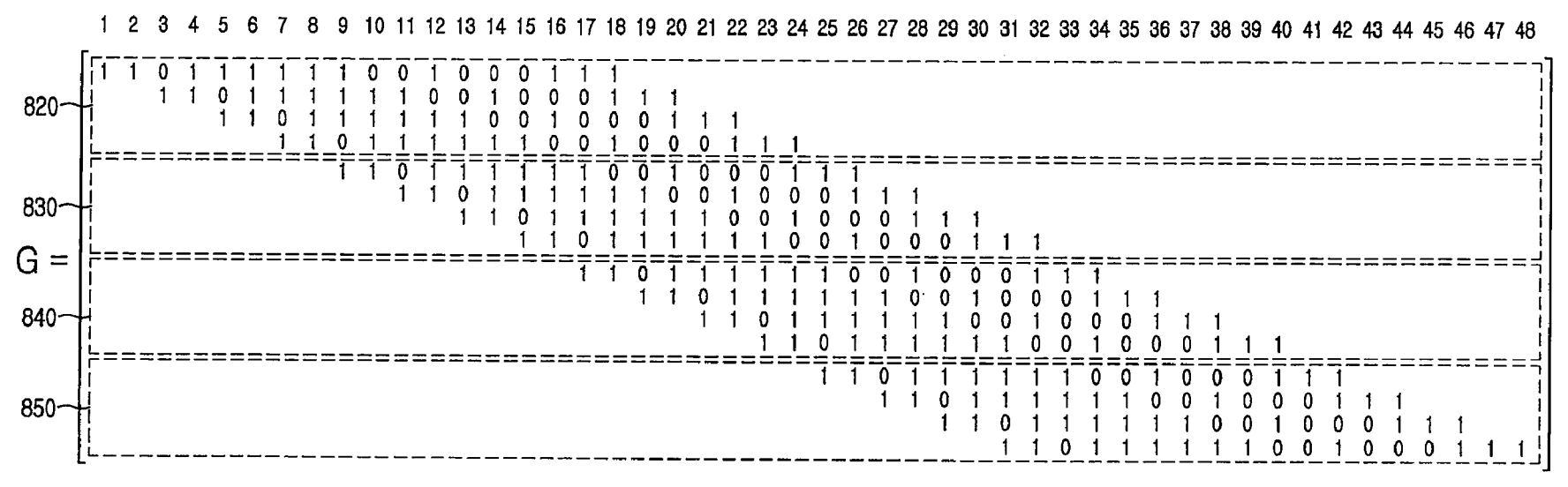

Referring to FIG. 8A, an operation of the UE-specific Scrambling code generator will be described. For example, a 16-bit UE ID is input to the code generator. Then a convolutional encoder 800 codes the UE ID using a code with code rate=½, constraint length=9 and generating polynomials=561 and 753, and generates 48 coded bits. The generated codeword is input to a puncturer 810. Then the puncturer 810 punctures 8 bits, and generates a 40-bit UE-specific Scrambling code. In order to replace the convolutional encoder 800 in the code generator with the code generator according to the present invention, a generating matrix based on the convolutional encoder 800 is shown as FIG. 8B. Regarding the generating matrix of FIG. 8B, the generating matrix is composed of 48 columns and 16 rows, the first row is determined according to the generating polynomial, and each row has a shifted form obtained by shifting a previous row by a reciprocal, or 2, of the code rate. In the third embodiment of the present invention, it is assumed that the number of input bits of the encoder is 16, and the 16 bits are coded after divided four by four. Therefore, the generating matrix is divided into 4 partial generating matrixes 820, 830, 840 and 850 each having 4 rows as shown in FIG. 8B, and when rearrangement information based on each of the partial generating matrixes is found as in the foregoing embodiments, the rearrangement information of the first to fourth partial generating matrixes can be defined as Equation (2) to Equation (5), respectively.

$$1,1,2,3,5,7,11,15,7,14,14,13,12,10,8,5,1,11,2,6,4,12,8, \\ 8,0,0,0,0,0,0,0,0,0,0, 0,0,0,0,0,0,0,0,0,0,0,0,0 \quad (2)$$

$$0,0,0,0,0,0,0,0,1,1,2,3,5,7,11,15,7,14,14,13,12,10,8,5, \\ 1,11,2,6,4,12,8,8,0,0,0, 0,0,0,0,0,0,0,0,0,0,0,0,0 \quad (3)$$

$$0,0,0,0,0,0,0,0,0,0,0,0,0,0,0,0,1,1,2,3,5,7,11,15,7,14, \\ 14,13,12,10,8,5,1,11,2,6,4,12,8,8,0,0,0,0,0,0,0,0 \quad (4)$$

$$0,0,0,0,0,0,0,0,0,0,0,0,0,0,0,0,0,0,0,0,0,0,0,0,1,1,2,3,5,7, \\ 11,15,7,14,14,13,12, 10,8,5,1,11,2,6,4,12,8,8 \quad (5)$$

Figure 9A:
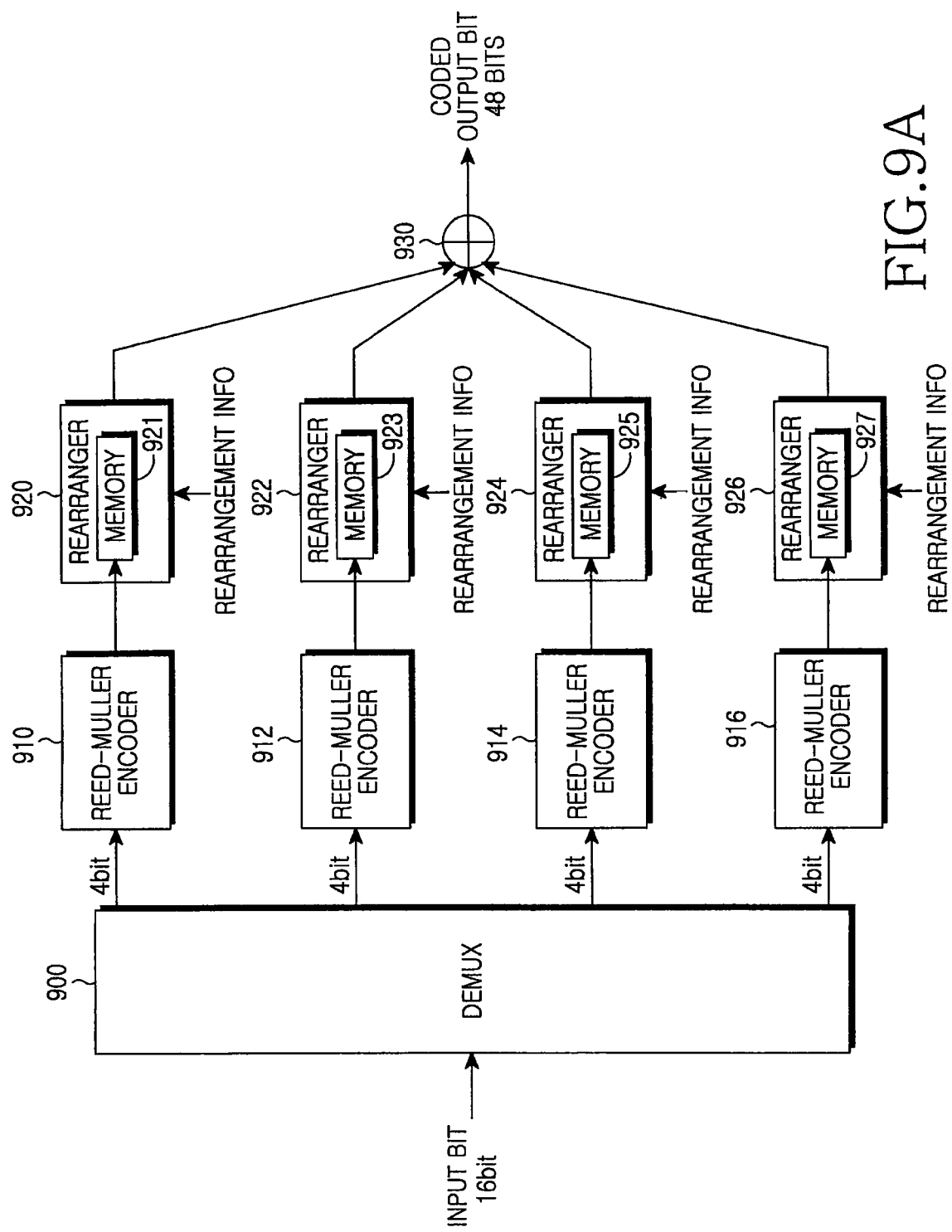
FIGS. 9A and 9B are block diagrams of code generators in which the generating matrix of FIG. 8B is realized with the encoder according to the present invention.

With reference to FIG. 9A, a description will now be made of an operation of a UE-Specific scrambling code generator according to the third embodiment of the present invention. Before a description of FIG. 9A is given, it is assumed that since the number of rows in each of the partial generating matrixes is 4, a Reed-Muller encoder used in the encoder is a (16,4) code.

FIG. 9A is a block diagram of a UE-Specific scrambling code generator according to the present invention.

When 16 input bits are input to an encoder according to the third embodiment, they are input to a demultiplexer 900. Then the demultiplexer 900 divides the 16 bits four by four, and outputs first 4 bits among the 16 bits to the first Reed-Muller encoder 910, the next 4 bits to the second Reed-Muller encoder 912, the next 4 bits to the third Reed-Muller encoder 914, and the last 4 bits to the last Reed-Muller encoder 916. Then, the first Reed-Muller encoder 910 Reed-Muller-codes the input signal, outputs 16 coded bits, and stores them in a memory 921 in a rearranger 920. At the same time, the second Reed-Muller encoder 912 Reed-Muller-codes the input signal, outputs 16 coded bits, and stores them in a memory 923 in a rearranger 922; the third Reed-Muller encoder 914 Reed-Muller-codes the input signal, outputs 16 coded bits, and stores them in a memory 925 in a rearranger 924; and the last Reed-Muller encoder 916 Reed-Muller-codes the input signal, outputs 16 coded bits, and stores them in a memory 927 in a rearranger 926. Then, the rearranger 920 receives the value of Equation (2) as rearrangement information based on the first partial generating matrix. The first rearranger 920 selects, from the memory 921, coded bits corresponding to the rearrangement information of Equation (2).

Next, the second rearranger 922 receives the value of Equation (3) as rearrangement information based on the second partial generating matrix. The second rearranger 922 selects, from the memory 923, coded bits corresponding to the rearrangement information of Equation (3).

The third rearranger 924 receives the value of Equation (4) as rearrangement information based on the third partial generating matrix. The third rearranger 924 selects, from the memory 925, coded bits corresponding to the rearrangement information of Equation (4).

The last rearranger 926 receives the value of Equation (5) as rearrangement information based on the last partial generating matrix. The last rearranger 926 selects, from the memory 927, coded bits corresponding to the rearrangement information of Equation (5). Then, the bits output from the rearrangers 920, 922, 924 and 926 are input to an XOR unit 930 where they are subjected to an XOR operation bit by bit, outputting a UE-specific scrambling code stream which is a 48-bit coded bit stream.

Regarding the generating matrix of FIG. 8B, according to a property of a generating matrix the convolutional code, each row of the generating matrix is a shifted form of its previous row. In addition, it can be appreciated that the partial generating matrixes are shifted forms of their previous partial generating matrixes. In FIG. 9A, a difference in operation between the Reed-Muller encoders 910, 912, 914 and 916 is equal to the entire operation time delay caused by a difference between the partial generating matrixes. A coding process based on the above property can be realized as shown in FIG. 9B.

Figure 9B:
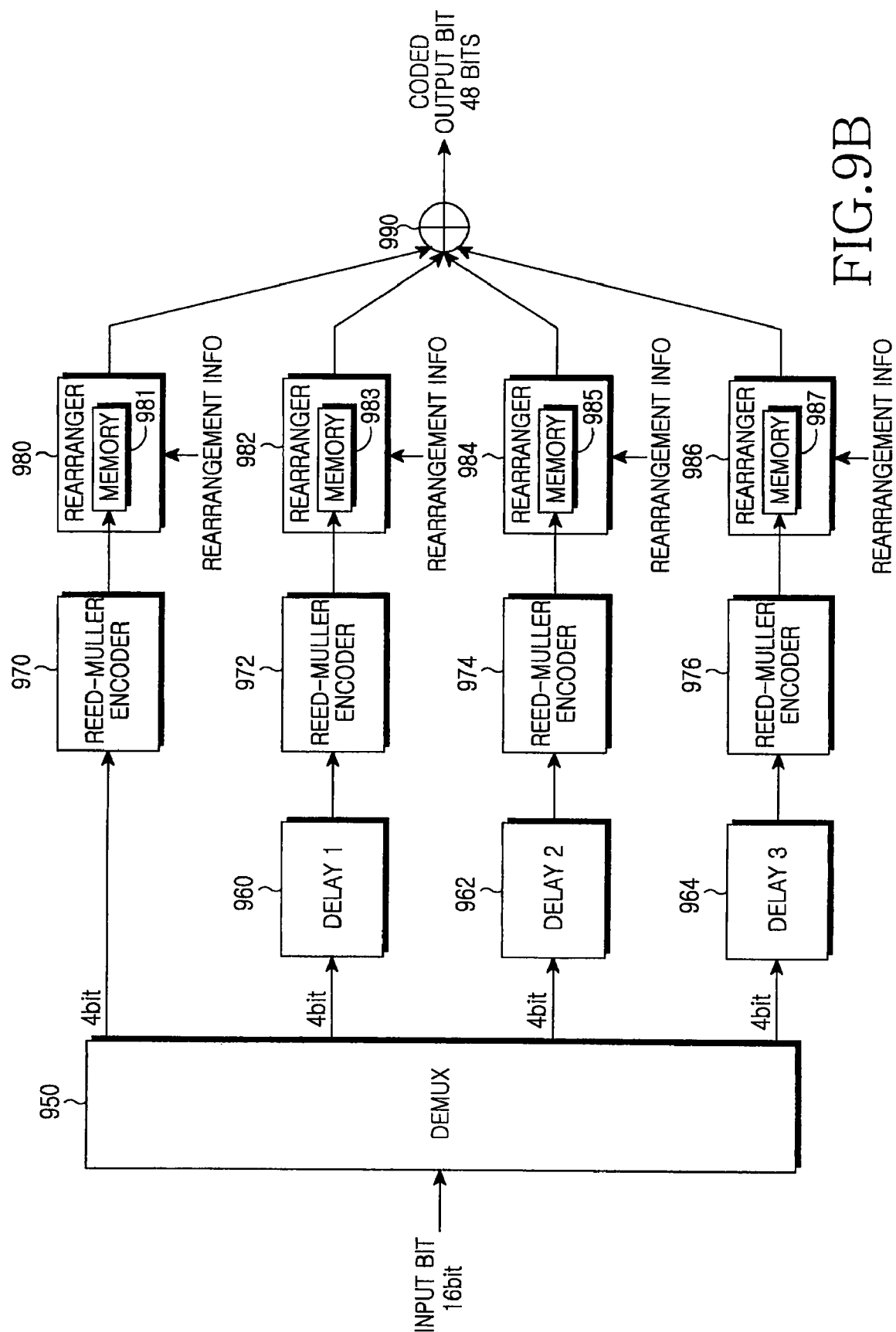

FIG. 9B is a block diagram of an encoder according to the third embodiment of the present invention. With reference to FIG. 9B, a description will now be made of a case where the third embodiment of the present invention is realized in another method.

When 16 input bits are input to an encoder according to the third embodiment, they are input to a demultiplexer 950. Then the demultiplexer 950 divides the 16 bits four by four, and outputs first 4 bits among the 16 bits to a Reed-Muller encoder 970, the next 4 bits to a delay #1 960, the next 4 bits to delay #2 962, and the last 4 bits to a delay #3 964. Then, the delay #1 960 time-delays the input 4 bits by a shift value between the first partial generating matrix and the second partial generating matrix of FIG. 8A, and then outputs them to a Reed-Muller encoder 972; the delay #2 962 time-delays the next 4 bits by a shift value between the first partial generating matrix and the third partial generating matrix of FIG. 8B, and then outputs them to a Reed-Muller encoder 974; and the delay #3 964 time-delays the last 4 bits by a shift value between the first partial generating matrix and the fourth partial generating matrix of FIG. 8B, and then outputs them to a Reed-Muller encoder 976. Then, the Reed-Muller encoder 970 Reed-Muller-codes the input signal, outputs 16 coded bits, and stores them in a memory 981 in a rearranger 980. At the same time, the Reed-Muller encoder 972 Reed-Muller-codes the input signal, outputs 16 coded bits, and stores them in a memory 983 in a rearranger 982; the Reed-Muller encoder 974 Reed-Muller-codes the input signal, outputs 16 coded bits, and stores them in a memory 985 in a rearranger 984; and the Reed-Muller encoder 976 Reed-Muller-codes the input signal, outputs 16 coded bits, and stores them in a memory 987 in a rearranger 986. Then, the rearranger 980 receives rearrangement information '1,1,3,2,3,1,2,2,0,0,0,0, 0,0,0,0' based on the first partial generating matrix, and selects, from the memory 981, coded bits corresponding to the rearrangement information; the rearranger 982 receives rearrangement information '1,1,3,2,3,1,2,2,0,0,0,0,0,0,0,0' used in the rearranger 980, and selects, from the memory 983, coded bits corresponding to the rearrangement information; the rearranger 984 receives rearrangement information '1,1, 3,2,3,1,2,2,0,0,0,0,0,0,0,0' used in the rearranger 980, and selects, from the memory 985, coded bits corresponding to the rearrangement information; and the rearranger 986 receives rearrangement information '1,1,3,2,3,1,2,2,0,0,0,0, 0,0,0,0' used in the rearranger 980, and selects, from the memory 987, coded bits corresponding to the rearrangement information.

Then, the coded bits output from the rearranger 980, the coded bits output from the rearranger 982, the coded bits output from the rearranger 984, and the coded bits output from the rearranger 986 are input to an XOR unit 990 bit by bit, where they are subjected to an XOR operation. That is, the XOR unit 990 XORs all the coded bits output from the encoders, thereby generating codewords based on the entire generating matrix of FIG. 8B.

The code generator of FIG. 9B delays an output time of coded bits, which are output values of the encoders 972, 974 and 976, using the delays. Although the delays 960, 962 and 964 can achieve the output delay in front of the Reed-Muller encoders 970, 972, 974 and 976, they can also perform the time delay at the back of the Reed-Mullet encoders 970, 972, 974 and 976, or at the back of the rearrangers 980, 982, 984 and 986. It can be appreciated from the third embodiment of the present invention that the code generator according to the present invention can operate to have the same input/output as the convolutional encoder used for generation of the existing UE-specific scrambling code.

Most of the above embodiments use the Reed-Muller encoders as encoders. This is because as stated above, regarding each column in the generating matrix of the Reed-Muller encoder, it represents all numbers expressible with as many binary numbers as the number of rows. However, codes other than the Reed-Muller code can also be used. For example, in the generating matrix of FIG. 1A, the columns are decimalized to 1, 2, 4, 5, 6 and 7, and there is no case where they are decimalized to 0 and 3. Therefore, when the structure of FIG. 2 is used as the code generator based on FIG. 1A, it is possible to generate the code of FIG. 1A, even though a code where columns of its generating matrix have only 1, 2, 4, 5, 6 and 7, is used in place of the Reed-Muller encoder 200. Therefore, a structure thereof will be described below with reference to the drawings.

Figure 11A:
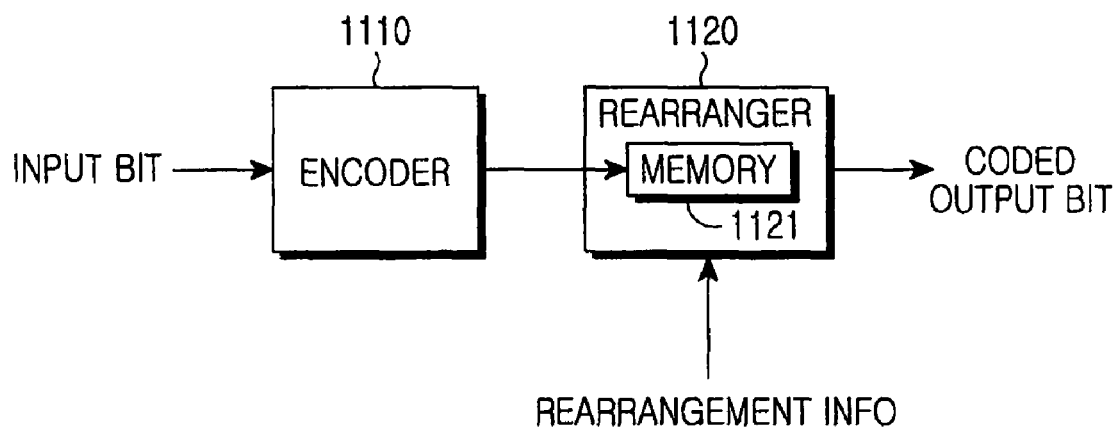
FIGS. 11A and 11B are block diagrams of encoders for generating the codewords of FIGS. 10A and 10B according to the present invention.

FIG. 10A illustrates a generating matrix of an encoder when columns of its generating matrix are decimalized only to 1, 2, 4, 5, 6 and 7. Therefore, with reference to FIG. 11A, a description will be made of a code generator capable of generating the code of FIG. 1A using a linear encoder having the generating matrix of FIG. 10A. For a description of the code generator, rearrangement information based on a generating matrix is found as follows. Since the first column of FIG. 1B is indicated by the fourth column of FIG. 10A, its rearrangement information is 3; since the second column of FIG. 1B is indicated by the third column of FIG. 10A, its rearrangement information is 2; since the third column of FIG. 1B is indicated by the first column of FIG. 10A, its rearrangement information is 0; since the fourth column of FIG. 1B is indicated by the sixth column of FIG. 10A, its rearrangement information is 5; since the fifth column of FIG. 1B is indicated by the fifth column of FIG. 10A, its rearrangement information is 4; since the sixth column of FIG. 1B is indicated by the second column of FIG. 10A, its rearrangement information is 1; and since the seventh column of FIG. 1B is indicated by the sixth column of FIG. 10A, its rearrangement information is 5. Therefore, the resulting rearrangement information is '3,2,0, 5,4,1,5'. With reference to FIG. 11A, a description will be made of an operation of a code generator by using the above rearrangement information. When 3 input bits are input to a code generator, the input signal is input to an encoder 1110, and the encoder 1110 codes the input signal according to the generating matrix of FIG. 10A. Then, the output signal is input to a rearranger 1120, and stored in a memory 1121 in the rearranger 1120. Then the rearranger 1120 receives rearrangement information '3,2,0,5,4,1,5', and sequentially outputs coded bits corresponding to the rearrangement information, thereby generating the final coded bits.

Shown is a process in which the code generator generates a linear code using an encoder rather than a Reed-Muller code. Further, with reference to FIGS. 10B and 11B, a description will be made of another code generator in a code generation method based on the generating matrix of FIG. 1A.

In generating a code based on the generating matrix of FIG. 1A, when the generating matrix of FIG. 10B is used, columns whose decimalized values are 6 and 7, are not shown in FIG. 10B. However, a column having a value of 6, i.e., a column having a binary value '110', can be obtained by XORing a column with a value '100', i.e., 4, and a column with a value '010', i.e., 2. That is, by using, as rearrangement information, combination information obtained by XORing some columns, including rearrangement, it is possible to generate a code based on the generating matrix of FIG. 1A using a code generator based on the generating matrix of FIG. 10B. Regarding the combination information, since the first column of FIG. 1B indicates the fourth column of FIG. 10B, its combination information is 3; since the second column of FIG. 1B indicates the third column of FIG. 10B, its combination information is 2; since the third column of FIG. 1B indicates the first column of FIG. 10B, its combination information is 0; since the fourth column of FIG. 1B indicates XOR of the second column and the fourth column of FIG. 10B, its combination information is (1,3); since the fifth column of FIG. 1B indicates XOR of the second column and the third column of FIG. 10B, its combination information is (1,2); since the sixth column of FIG. 1B indicates the second column of FIG. 10B, its combination information is 1; and since the seventh column of FIG. 1B indicates XOR of the second column and the fourth column of FIG. 10B, its combination information is (1,3).

Therefore, the resulting combination information becomes '3,2,0,(1,3),(1,2),1,(1,3)'. With reference to FIG. 13B, an operation of the code generator will be described using the combination information. When 3 input bits are input to a code generator, the input signal is input to an encoder 1150, and the encoder 1150 codes the input signal according to the generating matrix of FIG. 10B. Then, the output signal is input to a combiner 1160, and stored in a memory 1161 in the combiner 1160. Then the combiner 1160 receives combination information '3,2,0,(1,3),(1,2),1,(1,3)', and sequentially outputs coded bits corresponding to the rearrangement information. That is, the combiner 1160 outputs the fourth coded bit among the coded bits stored in the memory 1161 upon receipt of combination information 3; outputs the third coded bit among the coded bits stored in the memory 1160 upon receipt of combination information 2; outputs the first coded bit among the coded bits stored in the memory 1160 upon receipt of combination information 0; outputs an XOR value between the second and fourth coded bits among the coded bits stored in the memory 1160 upon receipt of combination information (1,3); outputs an XOR value between the second and third coded bits among the coded bits stored in the memory 1160 upon receipt of combination information (1,2); outputs the second coded bit among the coded bits stored in the memory 1160 upon receipt of combination information 1; and outputs an XOR value between the second and fourth coded bits among the coded bits stored in the memory 1160 upon receipt of combination information (1,3), thereby generating the final coded bits.

Figure 11B:
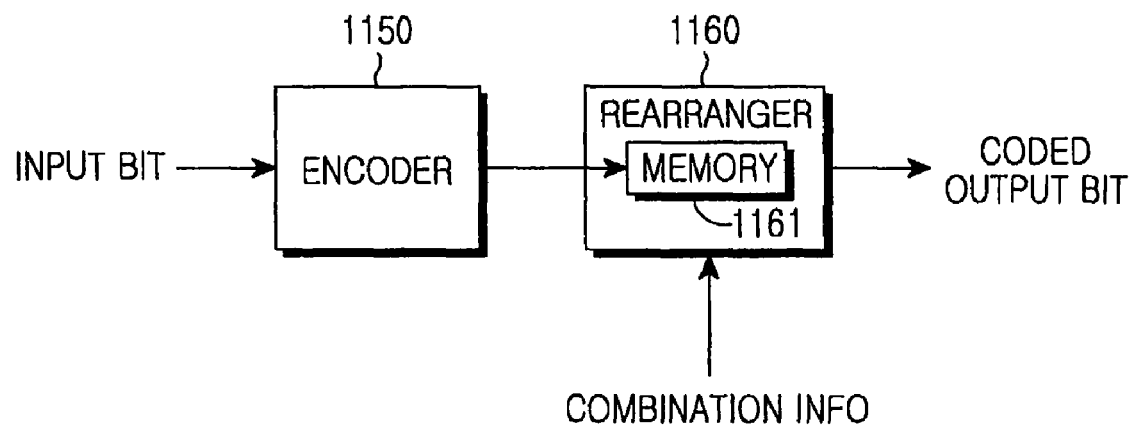

It is shown that the two encoder structures of FIGS. 11A and 11B can perform coding using various encoders other than the Reed-Muller encoder used in the foregoing embodiments.

Figure 12:
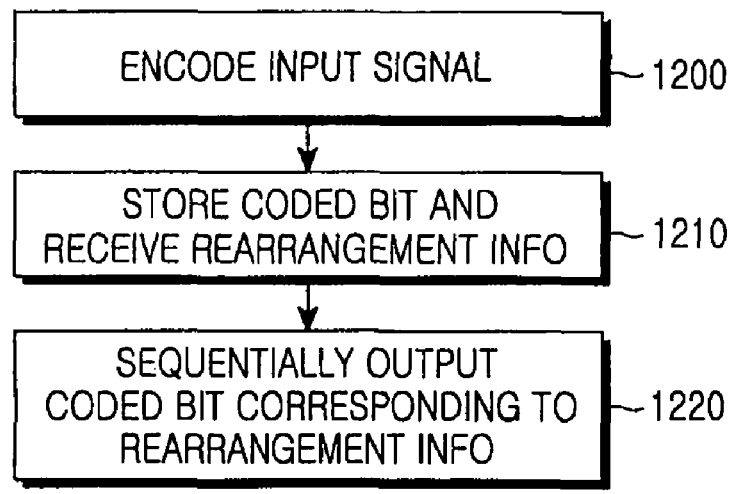
FIG. 12 is a flowchart illustrating a code generation process using rearrangement according to an embodiment of the present invention.

FIG. 12 is a flowchart illustrating a code generation process using rearrangement based on FIG. 2 and FIG. 11A.

Referring to FIG. 12, a code generator encodes an input signal in step 1200. That is, as the encoder used in step 1200, the Reed-Muller encoder shown in FIG. 2 can be used, or an encoder based on the generating matrix including columns of a generating matrix of a desired linear code can be used as shown in FIG. 11A. In step 1210, the code generator stores coded bits coded by the encoder used in step 1200, and receives rearrangement information for the code generator of the present invention so as to rearrange bits of the input signal coded in step 1200 according to column arrangement of the generating matrix that generates a desired linear code. In step 1220, the code generator sequentially outputs coded bit corresponding to the rearrangement information, thereby outputting the final coded bits.

Figure 13:
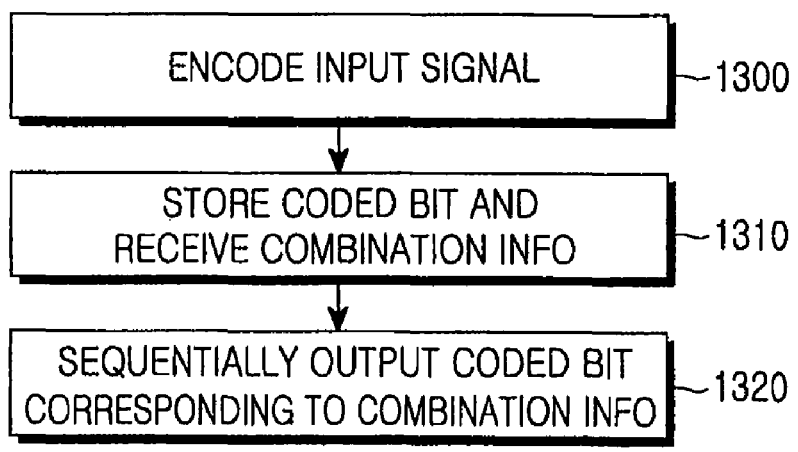
FIG. 13 is a flowchart illustrating a code generation process using rearrangement according to another embodiment of the present invention.

FIG. 13 is a flowchart illustrating a code generation process using rearrangement based on FIG. 11B.

Referring to FIG. 13, a code generator encodes an input signal in step 1300. That is, the encoder used in step 1300 means an encoder based on a generating matrix capable of expressing a generating matrix of a desired linear code using at least one combination of columns as shown in FIG. 11B. In step 1310, the code generator stores the coded bits of step 1300, and receives combination information for the code generator. In step 1320, the code generator sequentially outputs coded bits corresponding to the combination information, thereby outputting the final coded bits.

Therefore, the code generator according to the present invention can generate various linear codes with noticeably low complexity by using a simple structure.

What is claimed is:

1. A method for generating a linear code, the method comprising:
    coding input bits with a second coding scheme which is different from a first coding scheme for generating the linear code; and
    generating the linear code by rearranging the bits coded with the second coding scheme based on a first generating matrix for coding based on the first coding scheme.

2. The method of claim 1, wherein columns of the first generating matrix are equal to columns obtained by rearranging columns selected from a second generating matrix for coding based on the second coding scheme.

3. The method of claim 2, wherein at least one column in the first generating matrix is equal to a column obtained by exclusive ORing (XORing) the columns selected from the second generating matrix.

4. The method of claim 1, wherein coding comprises:
    dividing the input bits into a plurality of partial bits, and coding the partial bits with the second coding scheme.

5. The method of claim 4, wherein when the input bits are divided into a plurality of partial bits, a generating matrix for coding based on the second coding scheme is divided into partial generating matrixes corresponding to the plurality of partial bits.

6. The method of claim 5, wherein each row in the partial generating matrixes is equal to a row obtained by shifting a previous row by a reciprocal a code rate.

7. The method of claim 4, wherein generating comprises:
    rearranging the partial bits coded with the second coding scheme according to predetermined rearrangement information.

8. The method of claim 7, wherein the rearrangement information is different for each of the divided partial bits.

9. The method of claim 7, wherein the rearrangement information is equal for each of the divided partial bits.

10. The method of claim 9, further comprising:
    time-delaying at least one of the plurality of partial bits so that the rearrangement information becomes equal.

11. The method of claim 5, wherein generating comprises:
    generating the linear code by XORing, bit by bit, the partial bits rearranged after undergoing coding based on the second coding scheme.

12. The method of claim 1, wherein the first coding scheme is at least one of block coding, convolutional coding, turbo coding, and a Walsh code and m-sequence scheme.

13. The method of claim 1, wherein the second coding scheme is a Reed-Muller coding scheme.

14. The method of claim 1, further comprising:
    puncturing the generated linear code so that the linear code has a predetermined number of bits.

15. The method of claim 14, wherein the input bits are a User Equipment (UE) Identifier (ID), and the punctured linear code is a UE-specific scrambling code.

16. An apparatus for generating a linear code, the apparatus comprising:
    a coding unit for coding input bits with a second coding scheme which is different from a first coding scheme for generating the linear code; and
    a rearrangement unit for generating the linear code by rearranging the bits coded with the second coding scheme based on a first generating matrix for coding based on the first coding scheme.

17. The apparatus of claim 16, wherein in the coding unit, columns of the first generating matrix are equal to columns obtained by rearranging columns selected from a second generating matrix for coding based on the second coding scheme.

18. The apparatus of claim 17, wherein in the coding unit, at least one column in the first generating matrix is equal to a column obtained by exclusive ORing (XORing) the columns selected from the second generating matrix.

19. The apparatus of claim 16, further comprising:
a demultiplexer for dividing the input bits into a plurality of partial bits;
wherein the coding unit further includes a plurality of encoders for coding the partial bits with the second coding scheme.

20. The apparatus of claim 19, wherein when the demultiplexer divides the input bits into a plurality of partial bits, a generating matrix for coding based on the second coding scheme is divided into partial generating matrixes corresponding to the plurality of partial bits in the plurality of encoders.

21. The apparatus of claim 20, wherein in the plurality of encoders, each row in the partial generating matrixes is equal to a row obtained by shifting a previous row by a reciprocal a code rate.

22. The apparatus of claim 19, wherein the rearrangement unit comprises a plurality of rearrangers for rearranging the partial bits coded with the second coding scheme according to predetermined rearrangement information.

23. The apparatus of claim 22, wherein the rearrangement information is different for each of the divided partial bits.

24. The apparatus of claim 22, wherein the rearrangement information is equal for each of the divided partial bits.

25. The apparatus of claim 24, further comprising:
at least one delay for time-delaying at least one of the plurality of partial bits so that the rearrangement information becomes equal.

26. The apparatus of claim 20, further comprising:
an XOR unit for generating the linear code by XORing, bit by bit, the partial bits rearranged after undergoing coding based on the second coding scheme.

27. The apparatus of claim 16, wherein the first coding scheme is at least one of block coding, convolutional coding, turbo coding, and a Walsh code and m-sequence scheme.

28. The apparatus of claim 16, wherein the second coding scheme is a Reed-Muller coding scheme.

29. The apparatus of claim 16, further comprising:
a puncturer for puncturing the generated linear code so that the linear code has a predetermined number of bits.

30. The apparatus of claim 29, wherein the input bits are a User Equipment (UE) Identifier (ID), and the punctured linear code is a UE-specific scrambling code.

* * * * *